(12) United States Patent
Hashimshony et al.

(10) Patent No.: US 8,319,502 B2
(45) Date of Patent: Nov. 27, 2012

(54) RF CALIBRATION DEVICE AND METHOD

(75) Inventors: Dan Hashimshony, Givat Ada (IL); Gil Cohen, Jerusalem (IL); Iddo Geltner, Herzlia (IL)

(73) Assignee: Dune Medical Devices Ltd., Caesarea (IL)

( * ) Notice: Subject to any disclaimer, the term of this patent is extended or adjusted under 35 U.S.C. 154(b) by 445 days.

(21) Appl. No.: 12/147,090

(22) Filed: Jun. 26, 2008

(65) Prior Publication Data

US 2009/0322347 A1    Dec. 31, 2009

(51) Int. Cl.
*G01R 35/00* (2006.01)
(52) U.S. Cl. ........................................................ 324/601
(58) Field of Classification Search .................. 324/601, 324/637
See application file for complete search history.

(56) References Cited

U.S. PATENT DOCUMENTS

| | | | | |
|---|---|---|---|---|
| 5,248,933 A | * | 9/1993 | Venditti ............................ | 324/74 |
| 5,434,511 A | * | 7/1995 | Adamian et al. ............... | 324/601 |
| 6,215,295 B1 | * | 4/2001 | Smith, III ....................... | 324/601 |
| 6,417,674 B1 | * | 7/2002 | Rowell et al. .................. | 324/601 |
| 6,490,535 B1 | * | 12/2002 | Hansen .......................... | 324/601 |
| 6,870,359 B1 | * | 3/2005 | Sekel ......................... | 324/750.02 |
| 6,888,453 B2 | * | 5/2005 | Lutz et al. ...................... | 702/188 |
| 6,914,436 B2 | | 7/2005 | Liu | |
| 6,965,241 B1 | * | 11/2005 | Liu et al. ........................ | 324/601 |
| 7,013,229 B2 | * | 3/2006 | Wong et al. .................... | 702/107 |
| 7,068,049 B2 | * | 6/2006 | Adamian ........................ | 324/638 |
| 7,180,314 B1 | * | 2/2007 | Sekel ......................... | 324/750.02 |
| 7,405,575 B2 | * | 7/2008 | Tan et al. ........................ | 324/601 |
| 7,408,363 B2 | * | 8/2008 | Tan et al. ........................ | 324/601 |
| 7,414,411 B2 | * | 8/2008 | Tan et al. ........................ | 324/601 |
| 7,460,983 B2 | * | 12/2008 | Pickerd et al. ................. | 702/190 |
| 7,652,482 B2 | * | 1/2010 | Nakayama et al. ............ | 324/601 |
| 7,777,497 B2 | * | 8/2010 | Albert-Lebrun et al. ...... | 324/601 |
| 2004/0100276 A1 | * | 5/2004 | Fanton ............................ | 324/601 |

* cited by examiner

*Primary Examiner* — Timothy J Dole
(74) *Attorney, Agent, or Firm* — Browdy and Neimark, PLLC

(57) ABSTRACT

A measurement device is presented being configured to be connectable to an analyzer unit (including a network analyzer). The measurement device includes a measuring unit and a calibration and control unit connected to and integral with the measuring unit. The calibration and control unit is configured to enable connection of the measuring unit to the analyzer unit. The calibration and control unit includes a number of terminals of known RF reflection coefficients respectively and includes a memory utility carrying recorded data indicative of said RF reflection coefficients and recorded data indicative of RF transfer coefficients of the calibration and control unit. This configuration enables calculation of the RF response of the measuring unit while remaining integral with the calibration and control unit.

17 Claims, 6 Drawing Sheets

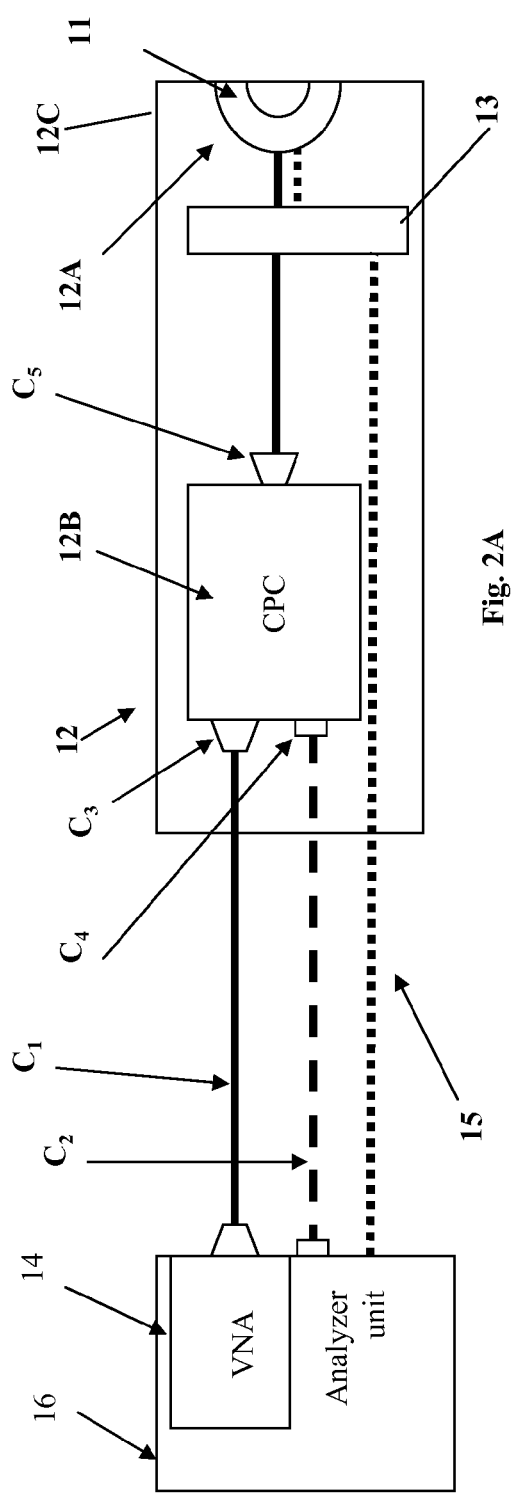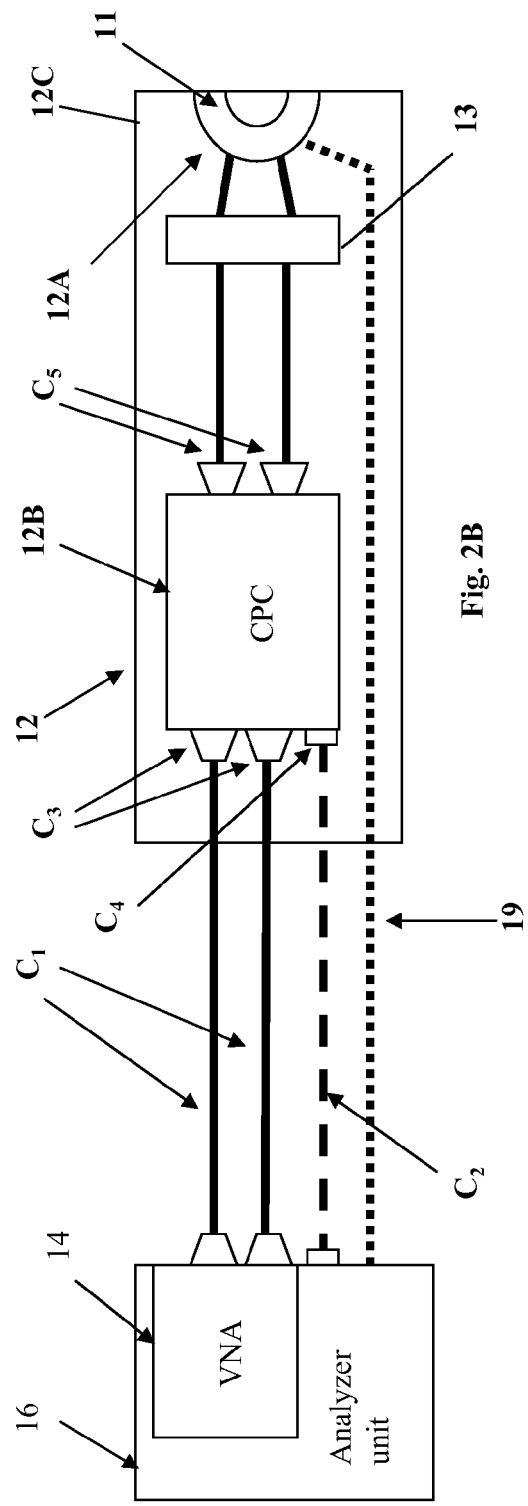

Phase 1 of calibration, off-line

Phase 2 of calibration, on-line

RF CALIBRATION DEVICE AND METHOD

FIELD OF THE INVENTION

This invention is generally in the field of calibration techniques, and relates to a calibration method and system for use with an RF measurement device.

BACKGROUND OF THE INVENTION

Calibration is an important process in any measurement technique: the higher the precision of calibration, the better are the measurement results, i.e. the higher the measurement system sensitivity to small measurement variations.

The RF calibration procedure is aimed at correcting measurement errors, thus ensuring that the response of a device under test (DUT) is recorded correctly. According to the conventional techniques of the kind specified, a vector network analyzer (VNA), including a signal transmitter/receiver, is frequently used; calibration loads are measured when connected to the appropriate signal ports of the VNA, such connection being carried out each time the calibration is to be performed. A calibration device includes a set of calibration loads or terminals with known loads. The calibration consists of switching (manually or automatically) between the calibration loads for sequentially measuring the response of the VNA for each of these loads, and by this determining how the signal propagation between the signal transmitting/receiving plane and the DUT connection plane is affected by a signal transmitting media in between these planes. Upon completing the calibration procedure, the calibration device is replaced by the DUT.

Some examples of the calibration procedure of the kind specified are described in U.S. Pat. No. 5,434,511 and U.S. Pat. No. 6,914,436.

GENERAL DESCRIPTION

There is a need in the art to facilitate an RF calibration procedure so as to, on the one hand, enable higher degree of precision of a calibration process, and, on the other hand, eliminate or at least significantly reduce a need for replacement between the calibration device and the DUT (measurement device). The latter feature is very important for various applications, for example those which do not allow frequent disconnection of a measurement device and/or do not allow access to the measurement device.

The present invention solves the above problem by providing a novel RF calibration method and system, allowing immediate transfer of the signal transmitting/receiving plane to the plane of connection to the measurement device. This is implemented by using the calibration device having loads or terminals of the known (previously tested) loads, and integrating such calibration device with the measurement device.

According to one broad aspect of the invention, there is provided a measurement device configured to be connectable to an analyzer unit, comprising a network analyzer, the measurement device comprising a measuring unit and a calibration and control unit connected to and integral with said measuring unit, said calibration and control unit being configured to enable connection of the measuring unit to the analyzer unit, said calibration and control unit comprising a number of terminals of known RF reflection coefficients respectively and comprising a memory utility carrying recorded data indicative of said RF reflection coefficients and recorded data indicative of RF transfer coefficients of the calibration and control unit, thereby enabling calculation of the RF response of the measuring unit while remaining integral with the calibration and control unit.

As the calibration and control unit is integral with the measuring unit, the calibration process (of the RF response) of the measuring unit may be carried out at any desired time, e.g. continuously or periodically.

The calibration unit comprises a controller utility, and a controllably operable switch enabling selective connection of each one of said terminals and said measurement unit to the network analyzer. The controller utility of the calibration and control unit is connectable to a controller of the analyzer unit.

According to another broad aspect of the invention, there is provided a calibration and control unit configured to be interconnected between an analyzer unit and a measuring unit by connectors capable for RF signal transmission, and to be connected to the analyzer unit via a data transmitting connector, the calibration and control unit comprising: a number of terminals of known RF reflection coefficients respectively; and a memory utility comprising recorded data indicative of the RF reflection coefficients of the terminals and recorded data indicative of RF transfer coefficients of the calibration and control unit.

According to yet another broad aspect of the invention, there is provided a method for use in calibrating a measurement device by connecting it to an analyzer unit comprising a network analyzer, the method comprising:

providing a calibration and control unit comprising: a number of terminals of known RF reflection coefficients respectively, and a memory utility carrying recorded data indicative of said RF reflection coefficients and recorded data indicative of RF transfer coefficients of the calibration and control unit;

integrating said calibration and control unit with the measuring unit, in a manner allowing connection of the measuring unit to the analyzer unit via said calibration and control unit; and calibrating the measuring unit by utilizing said known RF reflection coefficients and the RF transfer coefficients of the calibration and control unit, to determine an RF response of the measuring unit while remaining integral with the calibration and control unit.

The recorded data indicative of said RF reflection coefficients and of RF transfer coefficients of the calibration and control unit is provided by carrying out a pre-calibration procedure (phase 1 calibration) before integrating the calibration and control unit within the measurement device.

According to yet further aspect of the invention, there is provided a method for use in RF calibrating a measuring unit by connecting it to an analyzer unit comprising a network analyzer, the method comprising integrating a calibration and control unit with the measuring unit, in a manner allowing connection of the measuring unit to the analyzer unit via said calibration and control unit, where said calibration and control unit comprises a number of terminals of known RF reflection coefficients respectively and comprises a memory utility in which data indicative of said RF reflection coefficients and data indicative of RF transfer coefficients of the calibration and control unit is provided and stored before said calibration and control unit is integrated with the measuring unit, thereby enabling the RF calibration of the measuring unit when required without a need for disconnecting the measuring unit and the calibration and control unit.

Applications for which the invention may be useful include: environmental monitoring, for examples in oceans, in remote locations; geophysical, for example sensing in bore-holes, sensing in quarries; industrial, for example production line monitoring, monitoring in processing plants; medical: implantable devices, use in sterile environment.

Conditions in which the use of the invention may be advantageous include: sensor position is variable relative to console; inaccessibility to sensor location; sensor is disposable; sensor is operated in a hazardous environment; sensor is sterile; sensor is operated in a range of temperatures.

BRIEF DESCRIPTION OF THE DRAWINGS

In order to understand the invention and to see how it may be carried out in practice, embodiments will now be described, by way of non-limiting example only, with reference to the accompanying drawings, in which:

FIGS. 2A and 2B show examples of the configuration of the measurement system of FIG. 1;

DETAILED DESCRIPTION OF EMBODIMENTS

Figure 1:
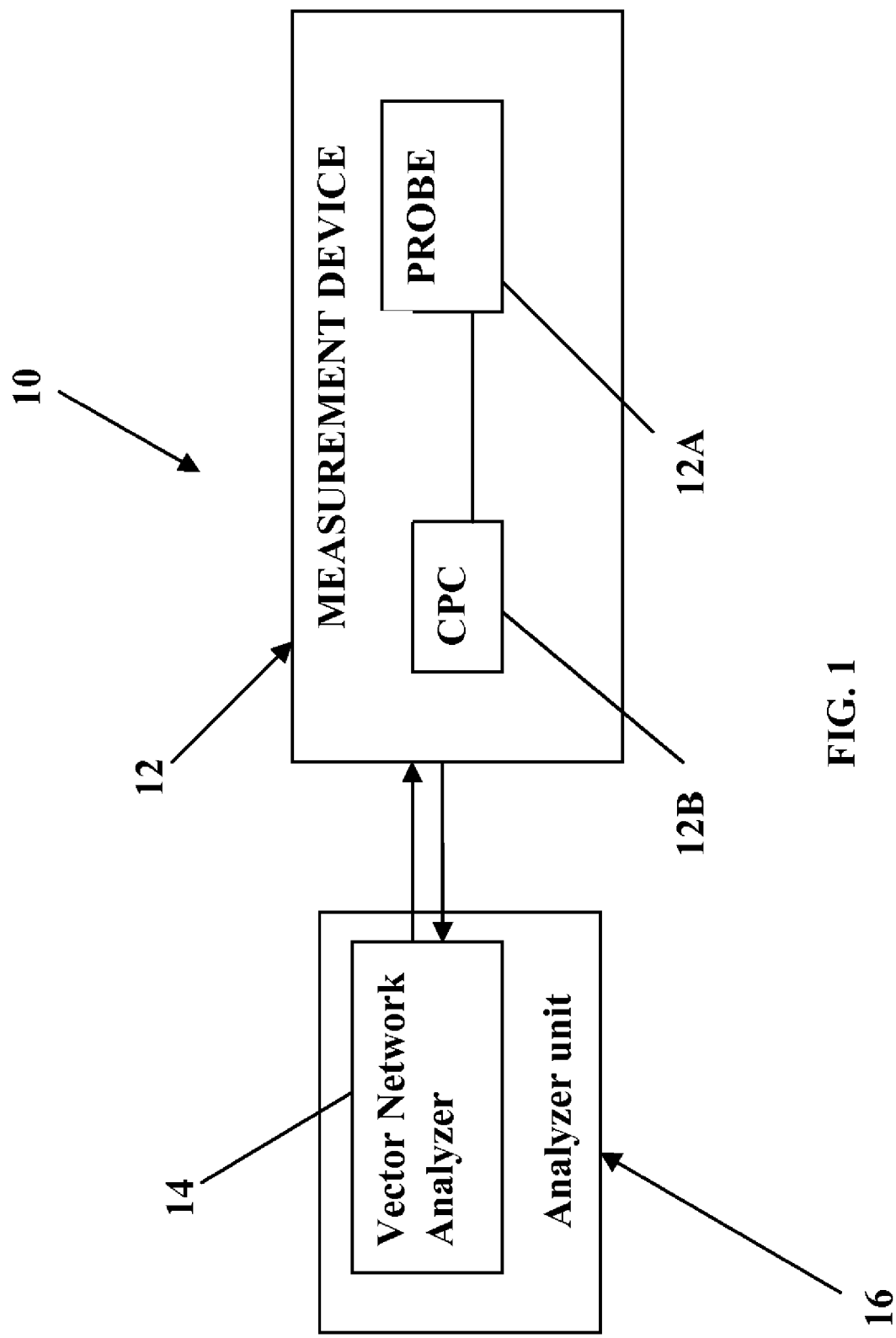
FIG. 1 is a block diagram of a measurement system according to the invention.

Referring to FIG. 1, there is illustrated, by way of a block diagram, a measurement system, generally designated 10, configured and operable according to the invention. The system 10 includes a measurement device 12 connectable to an analyzer 16. The measurement device 12 of the present invention includes a measuring unit (probe) 12A and a calibration and probe control (CPC) unit 12B. The analyzer 16 includes a network analyzer 14, and also a suitable communication unit (not shown) for handling digital and/or analog communication with the CPC unit 12B. The network analyzer 14 may be of any known suitable type and therefore need not be described in details, except to note that it is configured and operable for transmitting and receiving RF signals. Network analyzer 14 may be configured and operable as a vector network analyzer (VNA), for recording both the relative amplitude and phase of RF signals.

Network analyzer 14 is configured for transmitting and receiving RF signals via its signal ports, analyzing the received signals to determine the amplitude and, optionally, phase thereof which are indicative of the signal interaction with calibration loads, and delivering the calibration correction parameters. Network analyzer 14 is also configured for measuring a RF response of the measurement device 12 using the calibration correction parameters.

Additionally, the analyzer 16 is configured with additional features, responsible for security issues to prevent reuse of the measurement device 12 or installation of other non-authorized measurement device in the system, as will be described further below. Analyzer 16 may also provide at least one of the following facilities to measurement device 12: electrical power supply, means for handling digital and/or analog communication with measurement device 12, vacuum/pressure communication 19, a liquid dispensing line, optical signal communication, ultrasound signal communication, as well as provide control and power to an ablative/cutting apparatus/tool in measurement device 12, user and/or machine input and/or output, and control of other types of probes to be used in measurement device 12.

Reference is made to FIGS. 2A and 2B illustrating specific but not limiting examples of the configuration of the measurement system 10. The measurement device 12 includes a probe 12A and a CPC 12B integral with the probe 12A, which are accommodated in a common housing 12C. The probe 12A includes a sensor 11 with its support circuit 13 and is connected to the CPC 12B via a cable with an appropriate connector.

In the example of FIG. 2A, there is only one RF signal connection (RF port connection) between the analyzer 16 and the measurement device 12. This RF connection may be used, for example, but not limited to, when the sensor used in the probe 12A is configured for operation in reflection mode. Also, as exemplified in FIG. 2A, an optical signal cable 15 is optionally provided for transmitting optical signals to and/or from the sensor 11 in the probe 12A. In the example of FIG. 2B, there are two RF signal connections (RF port connections) between the analyzer 16 and the measurement device 12. These could be used, for example, but not limited to, when the sensor 11 used in the probe 12A is configured for operation both in the reflection and transmission modes, or, for example, when sensor 11 is configured for operation with two reflection mode signals. As also shown in the example of FIG. 2B, a vacuum/pressure communication line is used for providing vacuum/pressure communication 19 to the probe 12A.

It should be appreciated that embodiments of the present invention may utilize more than two RF signal connections between analyzer 16 and measurement device 12. There may generally be n RF signal connections (RF port connections) between the analyzer unit and measurement device, n being an integer greater than zero.

FIG. 2A shows more specifically the interface of the analyzer 16 to the measurement device 12. As shown cables $C_1$ and $C_2$ are provided, where cable $C_1$ is configured as a cable for RF signal transmission, for example a coaxial cable, and cable $C_2$ is configured for data transfer and control between units 12 and 16 and may be an USB cable, a coaxial cable, a cable for transmitting RS232 protocol data, a cable for transmitting GFSK protocol data, or any other cable known in the art as usable for supporting digital and/or analog communication. Cable $C_2$ may also support electrical power supply to measurement device 12. The CPC unit 12B is connected to cable $C_1$ via an RF grade connector $C_3$ (for example, male SMA), and is connected to cable $C_2$ via a connector $C_4$ (for example SMA, or USB), thus enabling the RF connection and data connection between measurement device 12 and analyzer 16. On the probe 12A side, the CPC unit 12B is connected to the probe via an RF grade connector $C_5$ (for example SMA). The RF grade connectors are appropriately selected to provide an interface that can define a calibration plain and give repeatable measurement results. The RF grade connectors are used for connecting all RF signal transmission paths (ports) between measurement device 12 and analyzer 16, and between CPC 12B and probe 12A. Examples of RF grade connectors include: N-Type, BNC, SMA SMB, MCX, MMCX, U.FL.

Preferably, the CPC unit (printed circuit board) is enclosed within a housing, having an RF cover, to provide mechanical strength and electromagnetic immunity to the CPC unit 12B. Mechanical strength of the housing enables better calibration by eliminating geometrical distortion, which may occur, for example, due to mechanical stresses or environmental changes of the CPC unit. This distortion may result in changes in the propagation of RF signals within the CPC unit, leading to degradation in calibration performance. Electromagnetic immunity of the housing enables better calibration by reducing RF interference of the CPC unit 12B with the probe 12A, and by reducing RF interference of external RF sources with the CPC unit 12B. Connectors of CPC unit 12B may be integrated into the housing. Housing may be constructed to enable operation of measurement device 12 in various environmental conditions, and to enable sterilization of the measurement device, by use of radiation and/or gas.

It should be noted, although not specifically shown, that the measurement device 12 may optionally include output (e.g. LED indicators) and/or input (e.g. control button) elements. These elements are associated with the probe 12A and used for controlling the operation thereof.

Figure 3:
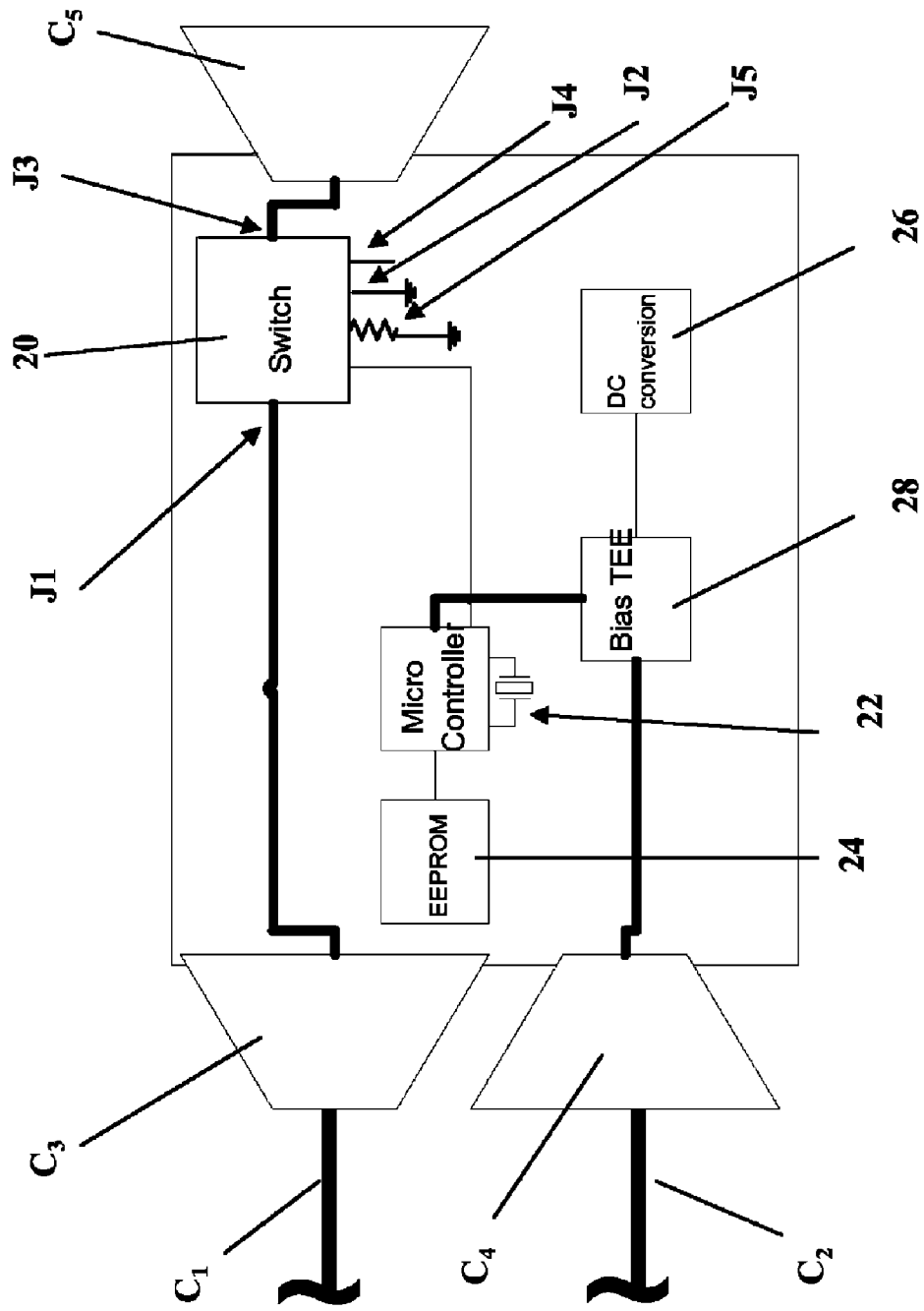
FIGS. 3 and 4 exemplify the configuration of a calibration and control unit suitable to be used in the measurement device of the present invention.

FIG. 3 illustrates a non limiting example of the configuration of the CPC unit 12B, suitable to be used in the system configuration of the above-described example of FIG. 2A, where there is only one RF signal connection (RF port connection) between an analyzer 16 and a measurement device 12. In this example, both data communication and power supply to measurement device 12 are delivered via a coaxial cable $C_2$ connected to connector $C_4$, with the data communication signals "riding" (superimposed) on a DC power supply voltage. As shown, the CPC unit 12B includes a switch 20 connected to a number of terminals, a controller/processor 22, a memory utility 24 to be used as code and data storage, a power conversion/stabilization unit 26, and a bias utility (BIAS-TEE) 28. Bias utility 28 is used to separate between the DC voltage supply from the analyzer 16 and the data communication signals riding on that DC. This voltage supply is filtered and appropriately regulated by power conversion/stabilization unit 26 (e.g. 5 Volt are converted to 3.3 volt supply by a linear voltage regulator (LVR)). This filtered and appropriately regulated voltage supply provides operating voltages for switch 20, controller/processor 22, memory 24, and other components within the measurement device that require electrical power to operate.

It should be appreciated that power/voltage supply to measurement device 12 may be provided using a separate electrical connection within cable $C_2$. In this case, there is no need to use a bias utility 28.

It should also be appreciated that power/voltage supply to measurement device 12 can be provided by a power/voltage source within the measurement device 12, such as a battery. In this case, there is no need for cable $C_2$ to accommodate for power supply to the measurement device 12.

The switch 20 may be soldered to the CPC circuit (printed circuit board). The switch has connection ports J1 and J3 associated with connections $C_3$ and $C_5$, and is also connected to a plurality of calibration loads. In the present example, the switch is associated with three calibration load terminals including a SHORT termination J2, OPEN termination J4, and LOAD termination J5. It is appreciated that other types of calibration loads may be used, as well as the number of calibration loads may be greater than three. The number and/or type of calibration loads may be selected in order to enhance the calibration accuracy. It is appreciated that switch 20 may have other than four switching states. Additionally, there may be more than one switch in the CPC unit, operable to provide a plurality of calibration loads.

Memory utility 24 may include volatile and/or non-volatile memory types. Examples of volatile memory types include: static random access memory (RAM), dynamic RAM. Examples of non-volatile memory types include: EEPROM, EPROM, flash memory, read only memory.

In some embodiments, memory 24 stores data characterizing the plurality of calibrations loads. Data characterizing the calibration loads may be frequency dependant. Data characterizing the calibration loads may also include data indicative of the dependence of the calibration loads' values on environmental parameters/conditions (for example: temperature, humidity, acceleration, mechanical agitation). Memory 24 also stores data characterizing the CPC unit 12B, which may be frequency dependant. This data may include the full 2-port complex parameters, transfer coefficients, (S11, S22, S12, and S21) of the CPC unit. Data characterizing the CPC may also include data indicative of the dependence of the CPC response on environmental parameters/conditions (for example: temperature, humidity, acceleration, mechanical agitation).

Memory 24 may also store data characterizing probe 12A. This data may include RF calibration data for RF signal propagation between connector $C_5$ and the sensor. This data may also include information regarding the specific response of the sensor support circuit and/or the sensor. This data may also include data indicative of the dependence of the probe's response on environmental parameters/conditions (for example: temperature, humidity, acceleration, mechanical agitation).

CPC unit may also include sensors to record values of environmental parameters. Also, the CPC unit may include sensors for determining the location/position of the measurement unit 12, for example a GPS receiver.

The CPC unit may be constructed such that RF signal propagation paths within it are in the form of Transmission lines (TL). The use of TL is useful, for example, for eliminating impedance mismatch, for reducing radiation, for reducing cross-talk within the CPC unit. Positioning of components on the CPC circuit board, and design of the CPC circuit board may be such as to reduce disturbance of RF signal propagation within the CPC unit. These disturbances may be associated with interference, losses, cross-talk, and noise. CPC unit may be constructed so that its size is typically less than half a wavelength of the RF signals that propagate through it. For example, for RF signals of about 1 GHz, the CPC's largest dimension size should be less than 10 cm. This is useful for eliminating cavity resonances within the CPC unit. CPC unit may be constructed so that its size is sufficiently small to minimize errors related to phase changes.

Figure 4:
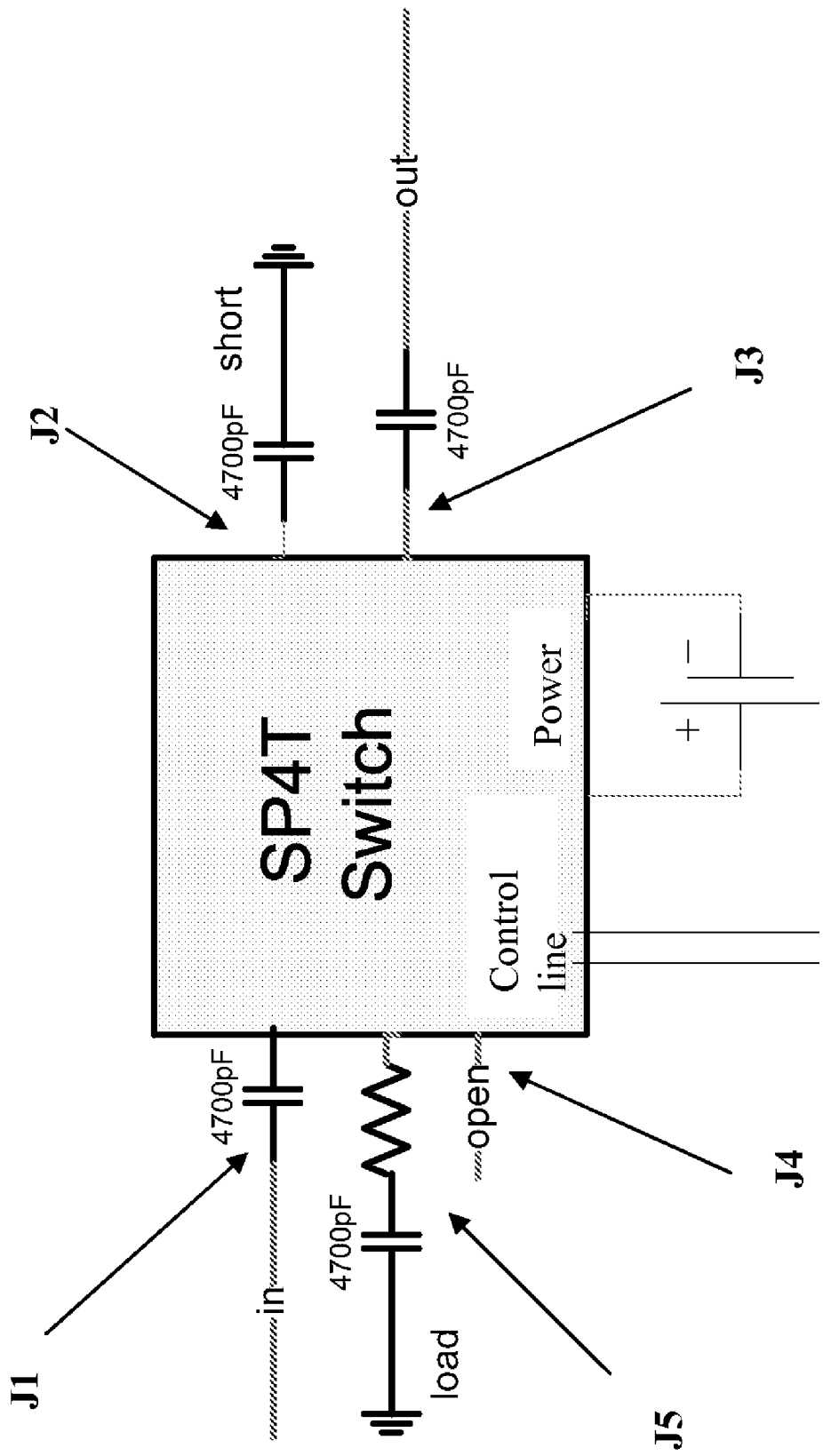

As exemplified more specifically in FIG. 4, the ports J1 and J3 of the switch (which may for example be AS204-80 commercially available from Skyworks Solutions, or HMC345LP3 commercially available from Hittite Microwave Corporation) are connected to the connections $C_3$ and $C_5$ (in FIG. 3) via 4700 pF capacitors. As also shown in the figure, the SHORT termination J2 is shorted to the ground through a 4700 pF capacitor, and the LOAD termination J5 is shorted to the ground through a resistor (50 Ohm SMT resistor) and through a 4700 pF capacitor. It should be understood that the ports of the switch are connected to 4700 pF capacitors in order to block the DC voltage that arises in use of certain types of switches. The open termination does not need any capacitor, and in the load termination it is best to place the capacitor after a resistor. It is appreciated that if the switch type used does not result in a DC voltage present at its ports (for example TS3V330 and/or TS5A3359 commercially available from Texas Instruments), there is no need to use capacitors.

Turning back to FIG. 3, during the calibration process, automated switching between the terminations J2, J4 and J5 is carried out using the controlled switch 20 on the CPC unit 12B. The S parameters, transfer coefficients, of the CPC (S11, S12, S21, S22) and the reflection coefficient of each calibration termination path (S11open, S11short and S11load) are stored in the memory utility 24. The operation of the memory utility 24 and the switching of the switch 20 are controlled by the microcontroller 22. Optionally, this controller 22 also controls the output (e.g. LED indicators) and/or input (e.g. control button) elements within the measurement device 12. The microcontroller 22 also communicates with a microcontroller (CPU) of the analyzer 16 via appropriate matching circuits for transferring data between analyzer 16 and measurement device 12, data to be further used for the calibration process. Additionally, the microcontroller 22 is preferably configured and operable to authenticate the measurement device 12 and to disable the reuse of the measurement device, as will be described further below.

According to the invention, the calibration procedure is a two-phase procedure including preliminary calibration (phase 1) which is carried out before integrating the CPC unit 12B with the measurement device 12. This allows for further "actual" calibration (phase 2) during the device 12 operation without a need for dissembling the CPC unit 12B from the measurement device 12A. Thus, in addition to the known in the art calibration procedure, which transfers the measurement plane from the VNA output to the input connector of a calibration unit, the measurement plane is immediately/instantaneously transferred from the analyzer output plane to the plane of connection to a measurement unit (probe 12A) within the measurement device.

Figure 5A:
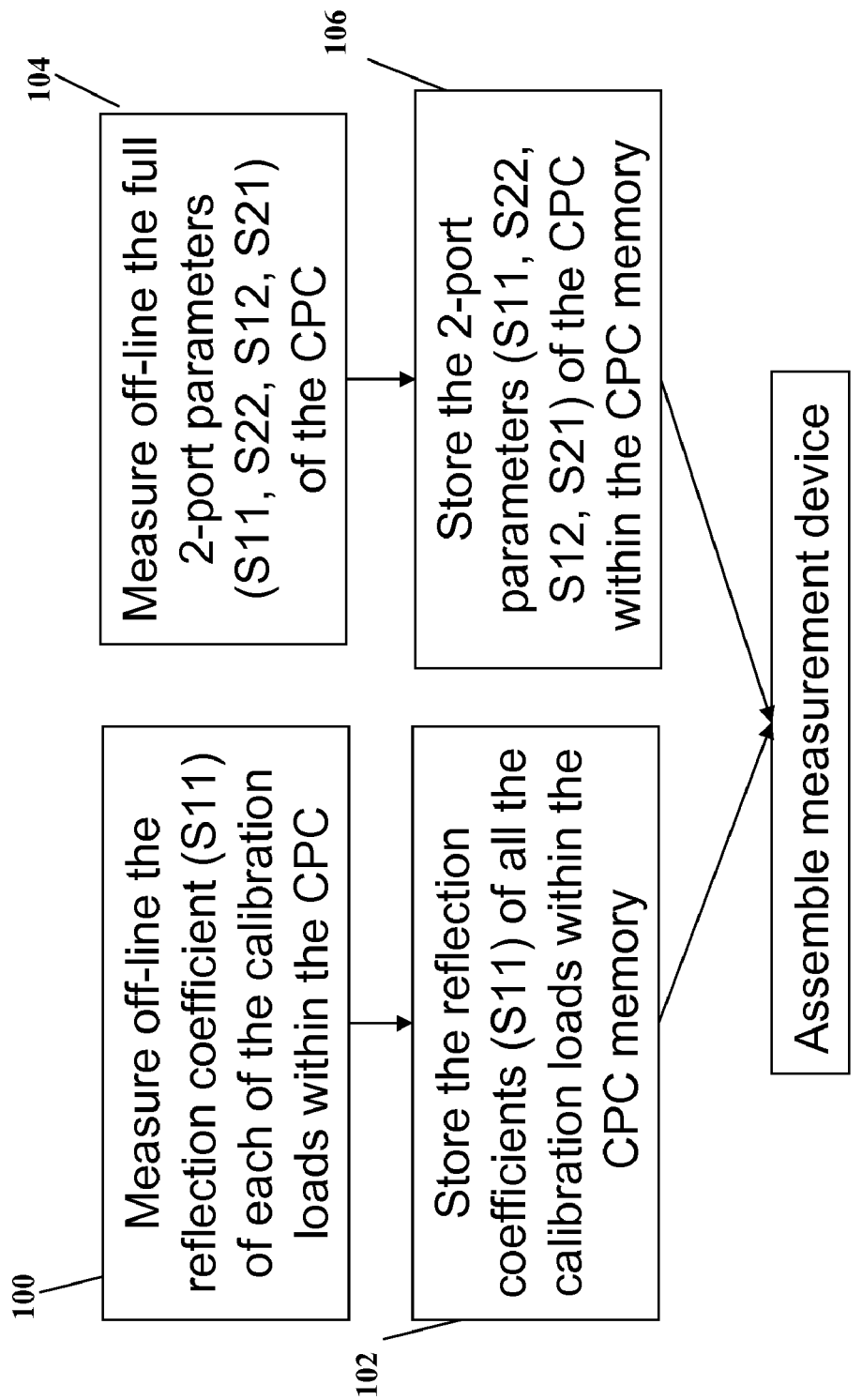
FIGS. 5A and 5B show a flow chart of an example of a calibration method of the present invention.
Figure 5B:
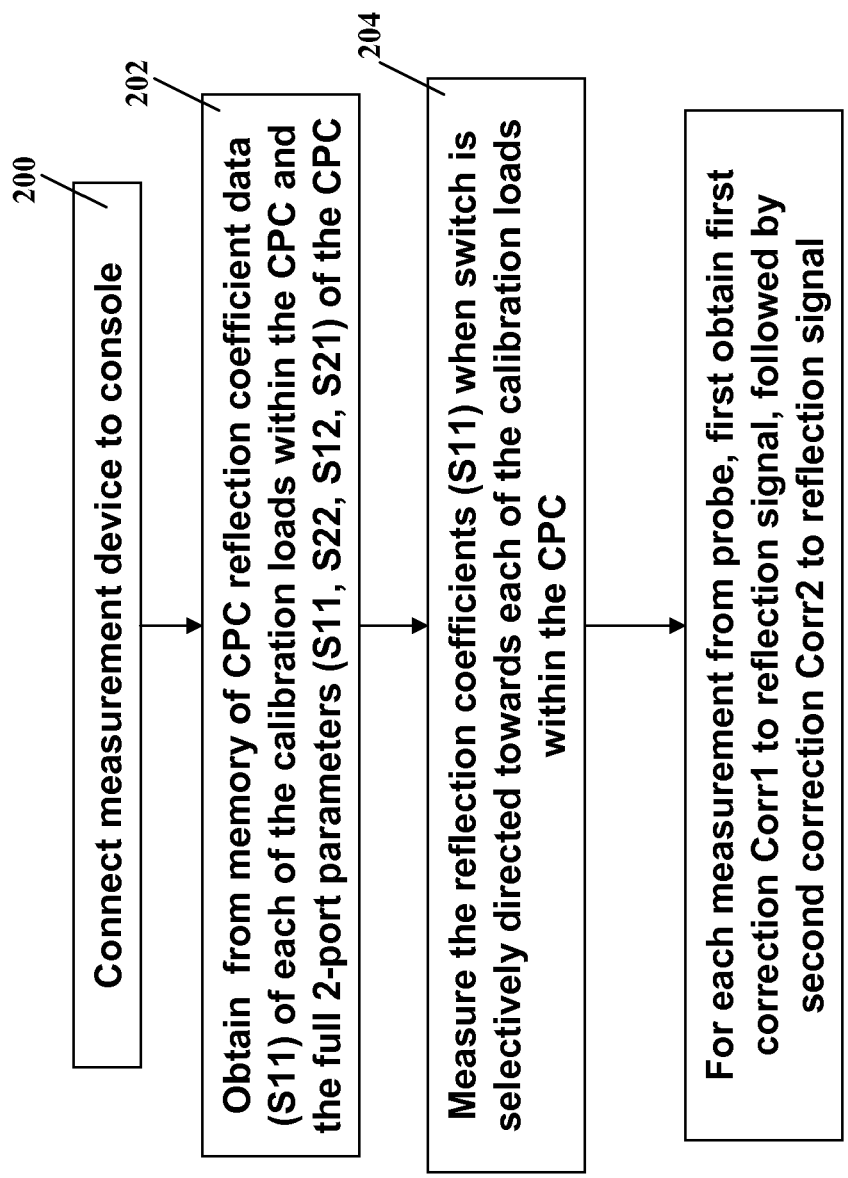

Reference is made to FIGS. 5A and 5B exemplifying a flow chart of a calibration method of the present invention. This example relates to the system configuration of FIG. 2A. It should however be understood that the same procedure may be employed when n RF signal connections (ports) are present and/or when the number of calibration loads is greater than three.

Initially, as illustrated in FIG. 5A, the calibration phase 1 is carried out off line, namely before the calibration unit is integrated with the measurement device. In this calibration phase 1, the complex reflection coefficients (S11) of the calibration loads S11open, S11short, and S11load are determined (step 100). Then, the full 2-port complex parameters, transfer coefficients, (S11, S22, S12, and S21) of the CPC unit 12B are determined (step 104). Step 104 is carried out when switch 20 is directed to port J3, that is the RF signal path within the switch is from port J1 to port J3. The reflection coefficient S11open corresponds to S11 of J1 when connected to J4; S11short corresponds to S11 of J1 when connected to J2; and S11load corresponds to S11 of J1 when connected to J5.

These S-parameters described above may be obtained in the standard manner known in the art. In the second stage of this calibration phase 1, data indicative of the above described S-parameters and the calibration loads (S11open, S11short, and S11load) is stored in the memory utility 24 (steps 102 and 106). Optionally, the above described S-parameters data may be fitted, and the fitting parameters are stored in the memory utility 24. The fitting enables the use of lesser memory storage space within memory utility 24.

Then, the measurement device is assembled by integrating a measuring unit (probe) 12A with the CPC unit 12B containing in its memory utility 24 data indicative of the above described S-parameters and the calibration loads (S11open, S11short, and S11load), measured during the phase 1 calibration. From this stage on, the measuring unit 12A and the calibration and control unit 12B are formed as an integral measurement device 12.

In operation of measurement device 12, when connected to analyzer 16, phase 2 calibration is carried out on line, utilizing the stored parameters, to calculate the corrections to the measured RF signals in order to transfer the signal measurement plane from the analyzer output plane to the plane of connection to the probe 12B within the measurement device. This is exemplified in FIG. 5B. The measured signal is corrected in two stages.

Measurement device 12 is first connected to analyzer unit 16 (step 200), and thus to network analyzer utility 14 thereof, via cables $C_1$, $C_2$, and additional cables if there are more signal ports. Each cable may be connected separately. Optionally, all cables may be incorporated into a dedicated connector, which is connected to a matching connector on analyzer 16. The use of a dedicated connector is advantageous, as it provides easier connection, faster connection and removal, and a high quality RF signal connection path. Connector may incorporate other cables and/or connections between analyzer unit 16 and measurement device 12. For example: vacuum/pressure communication line, liquid dispensing line, optical signal cable, ultrasound sensor cable, ablative/cutting apparatus/tool cable, or additional cables. Following connection, the stored reflection coefficient data (S11) of each of the calibration loads within the CPC unit and the full 2-port parameters (S11, S22, S12, S21) of the CPC are retrieved from memory 24 of the CPC unit to the analyzer 16 (step 202).

Then, after the measurement device 12 is positioned at a measurement location, the switch 20 is operated to selectively direct the RF signal path from network analyzer utility 14 to each of the calibration loads (J2, J4 and J5) within the CPC unit, and network analyzer utility 14 concurrently measures the reflection coefficients of each of the calibration loads within the CPC unit, and measured data recorded in the analyzer 16 (step 204). Here, $\Gamma 1$ is the measured reflection coefficient corresponding to the switch directed to open;

$\Gamma 2$ is the measured reflection coefficient corresponding to the switch directed to short;

$\Gamma 3$ is the measured reflection coefficient corresponding to the switch directed to load.

Measuring $\Gamma 1$, $\Gamma 2$, and $\Gamma 3$ only when measurement device 12 is in place ensures that the calibration accuracy will not be affected by spatial variations in the relative position of measurement device 12 and analyzer unit 16, and by changes in the positioning of the cables connecting them.

The analysis of the reflection and transmission coefficients provides that:

$$\Gamma m = S11 + S21 \cdot \Gamma a \cdot S12 + S21 \cdot \Gamma a \cdot S22 \cdot \Gamma a \cdot S12 + \ldots =$$

$$S11 + S21 \cdot \Gamma a \cdot S12 \cdot \sum_{n=0}^{\infty} (\Gamma a \cdot S22)^n =$$

$$\ldots = S11 + S21 \cdot S12 \cdot \frac{\Gamma a}{1 - S22 \cdot \Gamma a} \equiv Ed + Ert \cdot \frac{\Gamma a}{1 - Es \cdot \Gamma a}$$

wherein $\Gamma_m$ is the measured reflection coefficient; $\Gamma_a$ is the actual reflection coefficient;

Ed=S11 is the directivity error; Ert=S21*S12 is the reflection tracking error; and Es=S22 is the source match error.

When correcting a linear system, relationship between the measured reflection coefficient and the actual reflection coefficient is:

$$\Gamma m = Ed + Ert \cdot \frac{\Gamma a}{1 - Es \cdot \Gamma a}$$

After measuring the reflections from each one of the calibration terminations ($\Gamma 1$, $\Gamma 2$, $\Gamma 3$) and obtaining the actual reflections from the memory (S1=S11open, S2=S11short, S3=S11load) as determined during the preliminary (phase 1) calibration, the three errors can be calculated using the following formulas:

$$\Gamma 1 = Ed + Ert \cdot \frac{S1}{1 - Es \cdot S1}$$

$$\Gamma 2 = Ed + Ert \cdot \frac{S2}{1 - Es \cdot S2}$$

$$\Gamma 3 = Ed + Ert \cdot \frac{S3}{1 - Es \cdot S3}$$

$$\Rightarrow$$

$$Es = \frac{(\Gamma 2 - \Gamma 1)(S3 - S1) - (\Gamma 3 - \Gamma 1)(S2 - S1)}{S2(\Gamma 2 - \Gamma 1)(S3 - S1) - S3(\Gamma 3 - \Gamma 1)(S2 - S1)}$$

$$Ert = \frac{(\Gamma 2 - \Gamma 1)(1 - Es \cdot S1)(1 - Es \cdot S2)}{S2 - S1}$$

$$Ed = \Gamma 1 - \frac{Ert \cdot S1}{1 - Es \cdot S1}$$

$$\Rightarrow$$

$$Corr1 = \frac{Ed - \Gamma m}{Es \cdot Ed - Es \cdot \Gamma m - Ert}$$

wherein Corr1 is the result of the first stage of the correction to the RF signal reflection, and it accounts to transferring the measurement plane from the network analyzer output plane to the entrance plane of the CPC unit ($C_3$).

Following this correction, the signals measured when the switch was directed to the calibration loads within the CPC unit ($\Gamma 1$, $\Gamma 2$, $\Gamma 3$) are not used anymore, until an additional calibration sequences is initiated.

From this point on the switch 20 is directed to J3, that is, the RF signal path within the switch is from J1 to J3. Measurements by sensor may be performed at will, or automatically.

For each measurement performed by the sensor, an additional compensation for the CPC unit internal 2-port response is performed by use of the S parameters (S11, S22 and S12S21) of the CPC unit that were retrieved from the memory utility:

$$Corr1 = S11 + S21S12 \cdot \frac{Corr2}{1 - S22 \cdot Corr2}$$

$$\Leftrightarrow$$

$$Corr2 = \frac{Corr1 - S11}{Corr1 \cdot S22 + S12S21 - S11 \cdot S22}$$

wherein Corr2 is the result of the second stage of the correction to the RF signal reflection, and it accounts to transferring the measurement plane from the entrance plane of the CPC ($C_3$) to the input plane of the probe ($C_5$). The Corr2 corrected RF signal reflection is the final, fully calibrated, RF response signal for reflection.

It should be appreciated that when there is more than one RF port connection, multiple calibration and probe control (CPC) units (such as calibration and probe control unit 12B) are incorporated within measurement device 12; stages 1 and 2 of the above-described calibration process are performed for each RF signal port connection, resulting in obtaining the fully calibrated, RF response signal for each of the RF ports. As shown in FIG. 2B, a single control line ($C_2$) may be used to control the operation of all the multiple calibration and probe control (CPC) units.

Optionally, an additional stage of correction to the RF signal reflection may be incorporated, for transferring the measurement plane from the input plane of the probe ($C_5$) to the sensor measurement plane or sensor support circuit measurement plane. This correction is similar in form to the correction for Corr2, and it uses the parameters characterizing the 2-port response of the probe cable and optionally the probe support circuit. These 2-port response parameters are pre-measured and are stored in the CPC memory 24. In operation they are retrieved from memory 24 by the analyzer unit 16.

As described above, an additional calibration sequences (re-calibration) may be initiated "at any time".

The re-calibration may be invoked by the user, by the analyzer (either on a periodic basis, or based on some inputs), and/or by measurement device 12 (either on a periodic basis, or based on some inputs). This re-calibration is advantageous when spatial, temporal, environmental, or a combination of these conditions, have been changed. These changes can lead to degradation in the calibration of the RF signals, and thus re-calibration is important of keeping the accuracy level of the measured RF signals.

In particular, calibration can be performed before each measurement, that is, "calibration on the fly".

The procedure of re-calibration "picks-up" from stage 3 of phase 2 of the calibration process. That is, when switch is selectively directed towards each of the calibration loads within the CPC, the reflection coefficients (S11) are measured again and recorded in analyzer 16. Next, correction Corr1 is derived, as already detailed above. Following this correction, the switch 20 is directed to J3, that is, the RF signal path within the switch is from J1 to J3. Measurements by sensor may be performed at will, or automatically. For each measurement performed by the sensor, the additional correction Corr2 is carried out, as detailed above. Specifically, when working in mode of "calibration on the fly", following each measurement by sensor, the procedure of re-calibration is re-initiated.

As already described, re-calibration may be initiated due to sensing of environmental changes. Changes in environmental parameters may affect calibration, as the RF properties of components related to the path of the RF signal propagation may depend on environmental parameters. These changes can lead to degradation in the calibration of the RF signals, and thus re-calibration is important of keeping the accuracy level of the measured RF signals when values of environmental parameters are changed.

Sensing of environmental parameters may be performed by sensors in analyzer 16 and/or in measurement device 12. As already detailed, the data characterizing the dependence of components of measurement device 12 on the values of environmental parameters is stored in memory 24. All the stages of the calibration procedure, described with reference to FIGS. 5A-5B, can use the data characterizing the dependence of components of measurement device 12 on the values of environmental parameters, to enhance the accuracy of the calibration procedure.

Sensing of environmental parameters can be performed during the measurement procedure. Changes in environmental parameters can be used to trigger (initiate) re-calibration. The sensing of environmental parameters can be performed autonomously by measurement device 12. Triggering of re-calibration is initiated by measurement device 12, when change(s) in environmental parameter(s) is/are higher than corresponding threshold(s) stored in memory 24. The sensing of environmental parameters can be performed by analyzer 16, by recording the values of environmental parameters, from appropriate sensors in measurement device 12 and/or from appropriate sensors in analyzer 16. Triggering of re-calibration is initiated by analyzer 16, when changes in environmental parameters are higher than thresholds stored in the database of analyzer 16.

Optionally, values of environmental parameters are continuously, or selectively, saved/stored/recorded in memory 24 and/or database of analyzer 16.

Memory utility 24 may also store Identification (ID) data of the specific measurement device, optionally in an encrypted form. As indicated above, the present invention also provides for preventing undesirable reuse of the measurement device or installation of other non-authorized measurement device in the system. To this end, each probe 12A and/or each CPC unit 12B is/are associated with a unique ID data. During production of a measurement device, its unique ID data is stored in memory 24. In operation, microcontroller of the measurement device or of analyzer 16 operates to access the respective ID data in the memory utility, and carries out an identification process (for example: reads ID of the probe and/or CPC unit, performs authentication of ID data, compares ID data to database in analyzer 16, compares measured data to specific response of the sensor), and only thereafter allows initiation of the use of measurement device 12.

Memory 24 may also store measurement device usage data, optionally in an encrypted form. For example: time of use, number of uses, number of calibration sequences performed, number of executed connections of measurement device 12 to analyzer 16, number of measurements performed. This measurement device usage data may be used to monitor/"enforce"/limit/control the way in which the device 12 is used.

The invention claimed is:

1. A measurement device configured to be connectable to an analyzer unit, comprising a network analyzer, the measurement device comprising a measuring unit and a calibration and control unit connected to and integral with said measuring unit, said calibration and control unit being configured to enable connection of the measuring unit to the analyzer unit, said calibration and control unit comprising:
   at least three calibration load terminals of certain RF reflection coefficients;
   a memory utility storing recorded data provided in a first calibration procedure carried out off-line before integrating the calibration and control unit with the measuring unit, said recorded data being indicative of measured RF reflection coefficients of said at least three calibration load terminals and indicative of measured RF transfer coefficients of the calibration and control unit,
   at least one switch comprising first and second connection ports for connecting to the measurement unit and to the network analyzer respectively, and at least three connection ports for connecting to said at least three calibration load terminals respectively, the switch having at least four switching states associated with respectively said at least three calibration load terminals and said measurement unit, thereby enabling selective connection of each one of said calibration load terminals and said measurement unit to the network analyzer, enabling calculation of the RF response of the measuring unit while the measurement unit remains integral with the calibration and control unit, and
   a controller utility programmed for controlling operation of the memory utility and said at least one switch for recording the measured data indicative of said RF reflection coefficients of said at least three calibration load terminals and RF transfer coefficients of the calibration and control unit data to be further used for a calibration process for the measurement unit while the measurement unit remains integral with the calibration and control unit.

2. The device of claim 1, wherein the calibration and control unit is enclosed within a housing having an RF cover providing mechanical strength and electromagnetic immunity to the calibration and control unit.

3. The device of claim 1, wherein said data indicative of said RF reflection coefficients of the calibration loads comprises data indicative of dependence of the RF reflection coefficients of the calibration loads on environmental conditions including at least one the following: temperature, humidity, acceleration and mechanical agitation.

4. The device of claim 1, wherein the memory utility stores data characterizing the calibration and control unit.

5. The device of claim 4, wherein the data characterizing the calibration and control unit includes data indicative of dependence of an RF response of the calibration and control unit on environmental conditions including at least one of temperature, humidity, acceleration, mechanical agitation.

6. The device of claim 1, wherein the memory utility stores data characterizing the measuring unit.

7. The device of claim 6, wherein said data characterizing the measuring unit comprises at least one of the following: (i) RF calibration data for RF signal propagation between the calibration and control unit and said measuring unit; and (ii) data indicative of dependence of an RF response of said at least one measuring unit on environmental conditions including at least one of temperature, humidity, acceleration, mechanical agitation.

8. The device of claim 1, comprising one or more sensors for sensing one or more environmental conditions.

9. The device of claim 1, wherein the calibration and control unit comprises one or more sensors for determining a position of the measuring unit.

10. A calibration and control unit configured to be interconnected between an analyzer unit and a measuring unit by connectors capable for RF signal transmission, and to be connected to the analyzer unit via a data transmitting connector, the calibration and control unit comprising: at least three calibration load terminals of certain RF reflection coefficients; a memory utility storing data characterizing the calibrations loads and data characterizing the calibration and control unit, said stored data being recorded in a first calibration procedure carried out off-line before integrating the calibration and control unit with the measuring unit, said recorded data comprising recorded data indicative of measured values of the RF reflection coefficients of the calibration load terminals, and recorded data indicative of measured RF transfer coefficients of the calibration and control unit; at least one switch comprising first and second connection ports for connecting to the measurement unit and to the network analyzer respectively, and at least three connection ports for connecting to said at least three calibration load terminals respectively, the switch having at least four switching states associated with respectively said at least three calibration load terminals and said measurement unit, thereby enabling selective connection of each one of said calibration load terminals and said measurement unit to the network analyzer; and a controller utility programmed for controlling operation of the memory utility and operation of said at least one switch for recording the measured data indicative of said RF reflection coefficients of the calibration load terminals and RF transfer coefficients of the calibration and control unit data to be further used for a calibration process for the measurement unit between while the measurement unit remains integral with the calibration and control unit.

11. The calibration and control unit of claim 10, being enclosed within a housing having an RF cover providing mechanical strength and electromagnetic immunity to the calibration and control unit.

12. The calibration and control unit of claim 10, wherein said data characterizing the calibrations loads comprises data indicative of dependence of the RF reflection coefficients of the calibration loads on environmental conditions including at least one the following: temperature, humidity, acceleration and mechanical agitation.

13. The calibration and control unit of claim 10, wherein said data characterizing the calibration and control unit comprises data indicative of dependence of an RF response of the calibration and control unit on environmental conditions including at least one of temperature, humidity, acceleration, mechanical agitation.

14. The calibration and control unit of claim 10, wherein the memory utility stores data characterizing the measuring unit comprising at least one of the following: (i) RF calibration data for RF signal propagation between the calibration and control unit and said measuring unit; and (ii) data indicative of dependence of an RF response of said at least one measuring unit on environmental conditions including at least one of temperature, humidity, acceleration, mechanical agitation.

15. The calibration and control unit of claim 10, comprising one or more sensors for determining a position of the measuring unit.

16. A method for use in calibrating a measuring unit by connecting it to an analyzer unit comprising a network analyzer, the method comprising:

providing a calibration and control unit comprising: at least three calibration load terminals of certain RF reflection coefficients respectively; a memory utility carrying stored data comprising data recorded in a first calibration procedure carried out off-line before integrating the calibration and control unit with the measurement unit, recorded data indicative of measured values of the RF reflection coefficients of said at least three calibration load terminals and indicative of measured RF transfer coefficients of the calibration and control unit; and at least one switch comprising first and second connection ports for connecting to the measurement unit and to the network analyzer respectively, and at least three connection ports for connecting to said at least three calibration load terminals respectively, the switch having at least four switching states associated with respectively said at least three calibration load terminals and said measurement unit, thereby enabling selective connection of each one of said calibration load terminals and said measurement unit to the network analyzer;

integrating said calibration and control unit with the measuring unit, in a manner allowing connection of the measuring unit to the analyzer unit via said calibration and control unit; and, calibrating the measuring unit by retrieving from the memory utility and utilizing said measured values of the RF reflection coefficients of said at least three calibration load terminals and the RF transfer coefficients of the calibration and control unit, to determine an RF response of the measuring unit, while the measuring unit remains integral with the calibration and control unit.

17. A method for use in RF calibrating a measuring unit by connecting it to an analyzer unit comprising a network analyzer, the method comprising: integrating a calibration and control unit with the measuring unit, in a manner allowing connection of the measuring unit to the analyzer unit via said calibration and control unit, wherein said calibration and control unit comprises at least three calibration load terminals of certain RF reflection coefficients, a memory utility in which data indicative of measured values of the RF reflection coefficients of said at least three calibration load terminals and data indicative of RF transfer coefficients of the calibration and control unit is stored being provided in a first calibration procedure carried out off-line before said calibration and control unit is integrated with the measuring unit, and at least one switch comprising first and second connection ports for connecting to the measurement unit and to the network analyzer respectively, and at least three connection ports for connecting to said at least three calibration load terminals respectively, the switch having at least four switching states associated with respectively said at least three calibration load terminals and said measurement unit, thereby enabling selective connection of each one of said calibration load terminals and said measurement unit to the network analyzer, and a controller utility programmed for controlling operation of the memory utility and operation of said at least one switch for retrieving from the memory utility and utilizing the measured values of said RF reflection coefficients of said at least three calibration load terminals and RF transfer coefficients of the calibration and control unit data, thereby enabling RF calibration of the measuring unit when required without a need for disconnecting the measuring unit and the calibration and control unit.

* * * * *